United States Patent [19]
Suzuki

[11] Patent Number: 5,877,550
[45] Date of Patent: Mar. 2, 1999

[54] HYBRID MODULE AND METHOD OF MANUFACTURING THE SAME

[75] Inventor: Kazutaka Suzuki, Tokyo, Japan

[73] Assignee: Taiyo Yuden Co., Ltd., Tokyo, Japan

[21] Appl. No.: 895,301

[22] Filed: Jul. 16, 1997

[30] Foreign Application Priority Data

Jul. 31, 1996 [JP] Japan ................................ 8-219270

[51] Int. Cl.⁶ .......................... H01L 23/053; H01L 23/12
[52] U.S. Cl. ........................... 257/700; 257/698; 257/679
[58] Field of Search ................................ 257/723, 724, 257/685, 686, 679, 700, 698

[56] References Cited

U.S. PATENT DOCUMENTS

| | | |
|---|---|---|
| 4,612,083 | 9/1986 | Yasumoto et al. . |
| 5,280,192 | 1/1994 | Kryzaniwsky . |
| 5,565,706 | 10/1996 | Miura et al. . |
| 5,600,541 | 2/1997 | Bone et al. . |

FOREIGN PATENT DOCUMENTS 62-158336  7/1987  Japan .

*Primary Examiner*—Mahshid Saadat
*Assistant Examiner*—S. V. Clark
*Attorney, Agent, or Firm*—Flynn, Thiel, Boutell & Tanis, P.C.

[57] ABSTRACT

A hybrid module comprises a plurality of insulating layers which are laminated on one another and circuit patterns formed on each surface of the insulating layers and/or formed between the insulating layers, wherein the circuit patterns are connected with one another by through hole conductors. Further, the insulating layers are formed of layers each having a transmitting a laser beam, wherein the circuit patterns, which are formed between the insulating layers and overlaid on top of one another, are irradiated with a laser beam to be thermally fused.

6 Claims, 4 Drawing Sheets

HYBRID MODULE AND METHOD OF MANUFACTURING THE SAME

BACKGROUND OF THE INVENTION

1. Field of the Invention

The present invention relates to a hybrid module comprising a plurality of insulating layers, circuit patterns comprising conductive films, resistors, etc. formed on surfaces of or between the insulating layers, and circuit components mounted on or incorporated into the insulating layers, if need be, to constitute an electric circuit and a method of manufacturing the same.

2. Description of Related Art

Mounting of a multilayer capacitor and a multilayer inductor on a hybrid module has been generally performed by a solder reflowing method. Mounting of a semiconductor on the hybrid module has been generally performed by the wirebonding method, but recently has been performed by another method such as a flipchip bonding or a TAB system.

Further, there is proposed a mounting method, for example, as disclosed in JP-A 62-158336, for facilitating a high density packing or mounting of the hybrid module. This mounting method comprises implanting circuit components into a substrate made of a resin, covering the circuit components with a thin film made of a resin, etching the thin film to form contact holes, forming a conductive film on the thin film, etching the conductive film to form circuit patterns, and wiring the circuit components and the circuit pattern together.

However, the hybrid module as disclosed in JP-A 62-62-158336 needs a means for performing sputtering and etching processes for forming the circuit patterns or wiring patterns, leading to high manufacturing costs. Moreover, such a hybrid module also requires strict or high accuracy positioning between electrodes, circuit patterns and insulating layers on which circuit components are mounted. If one of these conductors, circuit patterns and insulating layers is displaced, the circuits are not wired together to thereby open the circuits partially. Accordingly, an expensive apparatus for positioning these circuit components is needed, and it takes much time for correcting the positioning between these components. As a result, it takes much time and labor for manufacturing the hybrid module. Still further, since sputtering and etching processes are sequentially repeated to form a plurality of layers in this hybrid module, circuit components such as a semiconductor device, etc., which are firstly mounted on the lowest layer, are subjected to many heating and chemical treatments, leading to the deterioration of reliability. Still further, since a resin alone is used for the insulating layer, it also causes a problem that a high reliability is not obtained.

SUMMARY OF THE INVENTION

In view of the problems of conventional hybrid modules, the present invention provides a hybrid module capable of easily wiring patterns between a plurality of insulating layers 1, 6, 9 and 10 with one another, of incorporating circuit components into the insulating layers 1, 6, 9 and 10, and of using an insulating layer other than a resin, such as a ceramic, and a method of manufacturing the hybrid module.

To achieve the above object, according to the present invention, the insulating layers 1, 6, 9 and 10, having through hole conductors at least a part thereof, are sequentially laminated on one another, and a part of the circuit patterns 2 is overlaid on top of another between the insulating layers 1, 6, 9 and 10 to be thermally fused so that the circuit patterns 2 formed between the insulating layers 1, 6, 9 and 10 are wired together. For example, the circuit patterns 2 are overlaid on top of another in a state where the insulating layers 1, 6, 9 and 10 are overlaid on top of another, and they are subjected to spot welding using a laser beam to be thermally fused.

That is, the hybrid module of the present invention comprises a plurality of insulating layers 1, 6, 9 and 10 which are laminated on one another, and circuit patterns 2 formed on each surface of the insulating layers and/or formed between the insulating layers 1, 6, 9 and 10 are connected with one another by through hole conductors 7, characterized in that the circuit patters 2, which are led between the insulating layers 1, 6, 9 and 10 and overlaid on top of another, are thermally fused.

Gap portions are defined in at least a part of the insulating layer 6, 9 and 10, and circuit components 3 are accommodated into the gap portions.

Further, the method of manufacturing a hybrid module according to the present invention comprises laminating the insulating layers 1, 6, 9 and 10 having through hole conductors 7, at least at a part thereof, and thermally fusing a part of the circuit patterns 2, which are led between the insulating layers 1, 6, 9 and 10 and overlaid on top of another.

Herein, at least one side of the insulating layers 1, 6, 9 and 10, between which the circuit patterns 2 to be thermally fused are formed, is formed of a layer capable of transmitting a laser beam (hereinafter defined as layer having a transmittance of laser beam), and the circuit patterns 2 are irradiated with a laser beam to be thermally fused.

In this method of manufacturing the hybrid module, the insulating layers 6, 9 and 10 having penetrated gap portions are used so as to incorporate the circuit components 3 thereinto, then the circuit components 3 are mounted in advance on other insulating layers 1, 6, 9 and 10 in positions corresponding to the gap portions before the insulating layers 6, 9 and 10 are laminated on one another and finally the circuit components 3 are accommodated into the gap portions. Thereafter, the gap portions are filled with the resin to hermetically seal the circuit components 3.

It is preferable that the sequentially laminated insulating layers 1, 6, 9 and 10 may be bonded to one another by layers having adhesive properties. It is preferable that a portion which does not need to be irradiated be irradiated with a laser beam if layers which can not transmit laser beam (hereinafter defined as layers having a non-transmittance of laser beam) are interposed between the insulating layers 1, 6, 9 and 10. It is more preferable that the adhesive layer serve as the layer having a non-transmittance of a laser beam.

In the hybrid module and the method of manufacturing the same according to the present invention, since the insulating layers 6, 9 and 10 having main surfaces to which the circuit patterns 2 are connected by the through hole conductors 7 can be used, it is possible to use the insulating layers having the circuit patterns 2 and the through hole conductors 7 formed thereon by a so-called thick film method as the insulating layers 1, 6, 9 and 10. Firstly, the circuit patterns 2 having a width to some extent are led from the main surfaces of the insulating layers 6, 9 and 10, and they are overlaid on each other partially, then the overlaid portion is irradiated with a laser beam to be thermally fused. As a result, this method does not require a highly accurate positioning compared with the method using sputtering and etching processes to wire the circuit patterns 2 of the insulating layer 1, 6, 9 and 10 together.

Further, when the insulating layers 6, 9 and 10 having penetrated gap portions are laminated on one another and the circuit components 3 are accommodated into the gap portions, the circuit components can be packed or mounted at a high density as compared to the case where the circuit components are mounted only on the surfaces of the insulating layers 1 and 10.

With such an arrangement of the hybrid module of the present invention, the circuit patterns can be easily wired together between a plurality of insulating layers 1, 6, 9 and 10. Further, the circuit components can be incorporated into the insulating layers 6, 9 and 10, and also an insulating layer made of other than a resin, such as a ceramic, can be used. Accordingly, a high density packing or mounting can be performed, thereby obtaining a high reliable hybrid module.

PREFERRED EMBODIMENT OF THE INVENTION

A hybrid module and a method of manufacturing the same will be now described in detail more specifically with reference to the attached drawings.

Figure 1:
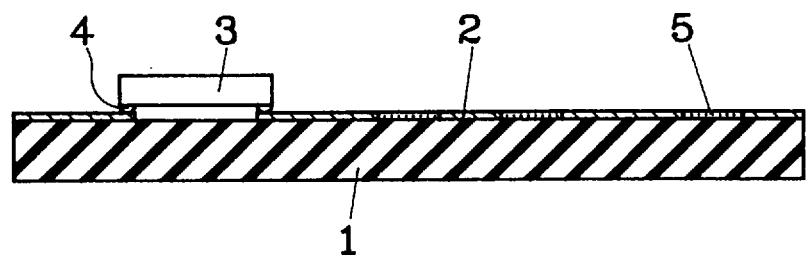
FIG. 1 is a longitudinal cross-sectional view showing a first step in a method of manufacturing a hybrid module according to the present invention.

Firstly, as shown in FIG. 1, a first insulating layer 1 is prepared. A circuit pattern 2 comprising a film of a conductor and a resistor is formed on the first insulating layer 1, and a circuit component 3, such as a semiconductor device, is mounted on a land electrode serving as a part of the circuit pattern 2, and a terminal 4, such as a solder bump, is conductively fixed to the circuit pattern 2. The circuit component 3 is mounted in a position corresponding to a penetrated gap portion defined in a second insulating layer 6 to be laminated next.

A coating layer 5 is formed on a main surface of the first insulating layer 1 at a position other than the positions where the circuit pattern 2 is formed and the circuit component 3 is mounted. The coating layer 5 is formed to bond the first insulating layer 1 and the second insulating layer 6 laminated on the first insulating layer 1 and it comprises a resin having adhesive properties, such as an epoxy resin, an acrylic resin and a silicon resin. The coating layer 5 may be formed of a resin having a non-transmittance of a laser beam, for example, a white silicon resin.

Figure 2:
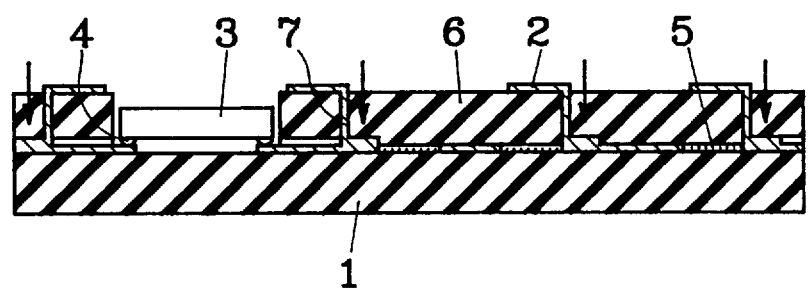
FIG. 2 is a longitudinal cross-sectional view showing a second step in the same method.

Secondly, as shown in FIG. 2, the second insulating layer 6 is laminated on the first insulating layer 1, and it is bonded onto the main surface of the first insulating layer 1 by the coating layer 5.

The second insulating layer 6 is formed of a material capable of transmitting a laser beam such as a glass, a glass-ceramic, aluminum nitride, a glass-epoxy resin and a polyimide resin. A penetrated gap portion is defined in the second insulating layer 6 and the circuit component 3 is accommodated into the gap portion.

A through hole conductor 7 is formed by penetrating the second insulating layer 6, and circuit patterns 2 are respectively formed on both main surfaces of the second insulating layer 6, wherein part of the circuit patterns 2 forms a through hole land communicating with the through hole conductor 7. The part of the circuit pattern 2 forming the through hole land is overlaid on the part of the circuit pattern 2 formed on the main surface of the first insulating layer 1 and the overlaid portions of the circuit pattern 2 are subjected to a thermal fusion. As a method or means for thermally fusing the circuit patterns 2, the overlaid portion of the circuit patterns 2 is irradiated with a laser beam applied from a laser source of, e.g., a YAG laser, through the second insulating layer 6 as shown by an arrow in FIG. 2, thereby locally fusing a film material of the circuit pattern 2 by the heat of absorption to re-cure the film material.

Figure 3:
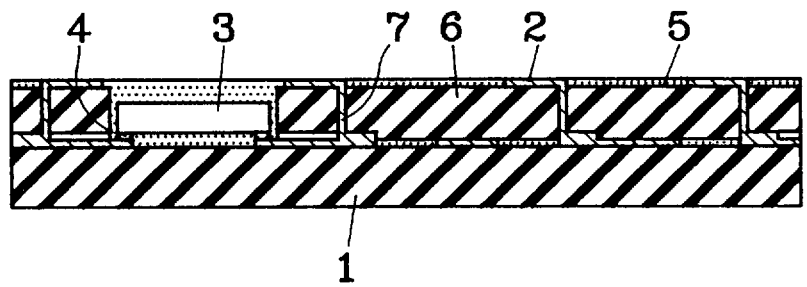
FIG. 3 is a longitudinal cross-sectional view showing a third step in the same method.

Thirdly, as shown in FIG. 3, the gap portion into which the circuit component is accommodated is filled with a resin to hermetically seal the circuit component 3. Further, the coating layer 5 is formed on the main surface of the first insulating layer 1 except for the circuit patterns 2 formed on the main surface of the second insulating layer 6.

Figure 4:
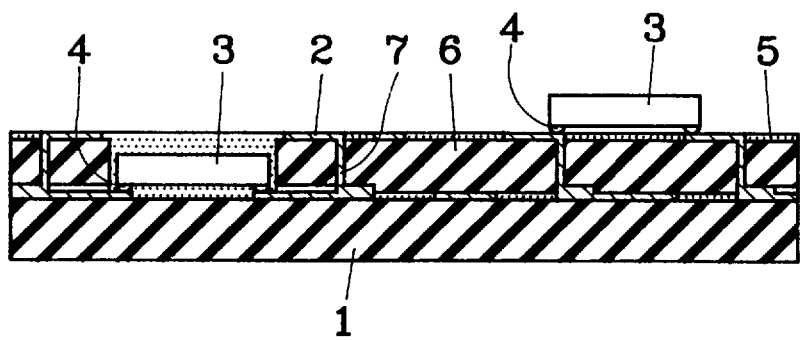
FIG. 4 is a longitudinal cross-sectional view showing a fourth step in the same method.
Figure 5:
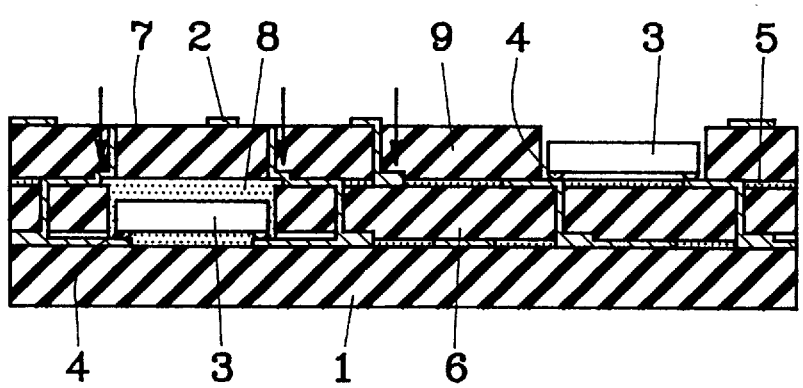
FIG. 5 is a longitudinal cross-sectional view showing a fifth step in the same method.

Fourthly, as shown in FIG. 4, the circuit components 3, such as a semiconductor device, are mounted on land electrodes serving as a part of the circuit patterns 2 on the second insulating layer 6, and terminals 4 of the circuit components 3 are conductively fixed to the circuit patterns 2.

Fifthly, a third insulating layer 9 is laminated on the second insulating layer 6 and bonded onto the main surface of the second insulating layer 6 by the coating layer 5. The third insulating layer 9 is made of the same material as the second insulating layer 6, and another circuit component 3 is accommodated into a gap portion of the third insulating layer 9. Further, a part of the circuit patterns 2, such as the through hole conductor 7 formed on the main surface of the third insulating layer 9, is overlaid on top of a part of the circuit patterns 2 formed on the main surface of the second insulating layer 6, and the overlaid portion is irradiated with a laser beam through the third insulating layer 9 to thermally fuse the circuit patterns 2.

Figure 6:
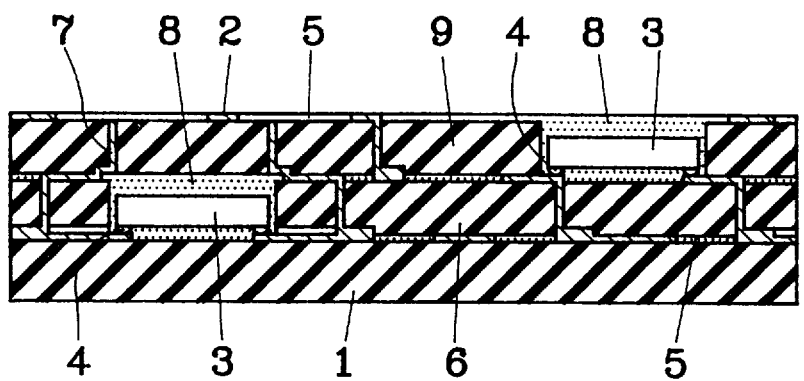
FIG. 6 is a longitudinal cross-sectional view showing a sixth step in the same method.

Sixthly, as shown in FIG. 6, the gap portions into which the circuit components 3 are accommodated are filled with a resin to hermetically seal the circuit components 3. The coating layer 5 is formed on the main surface of the first insulating layer 1 except for the circuit patterns 2 formed on the main surface of the third insulating layer 9.

Figure 7:
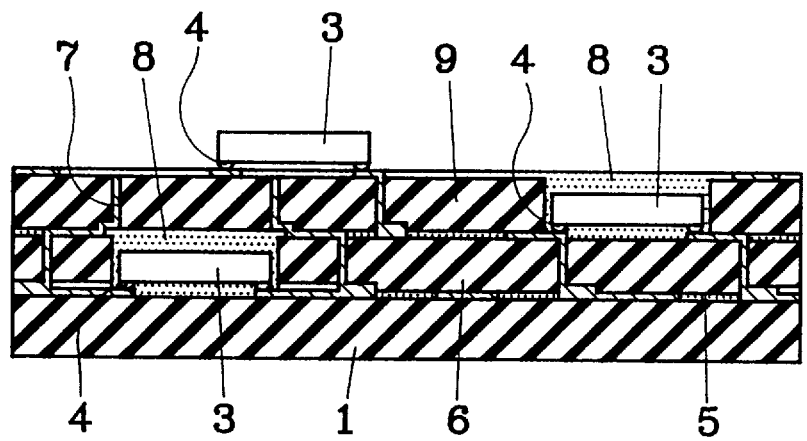
FIG. 7 is a longitudinal cross-sectional view showing a seventh step in the same method.

Seventhly, as shown in FIG. 7, a circuit component 3, such as a semiconductor device, is mounted on the land electrodes serving as a part of the circuit patterns 2 on the third insulating layer 9 and the terminals 4 thereof are conductively fixed to the circuit patterns 2.

Figure 8:
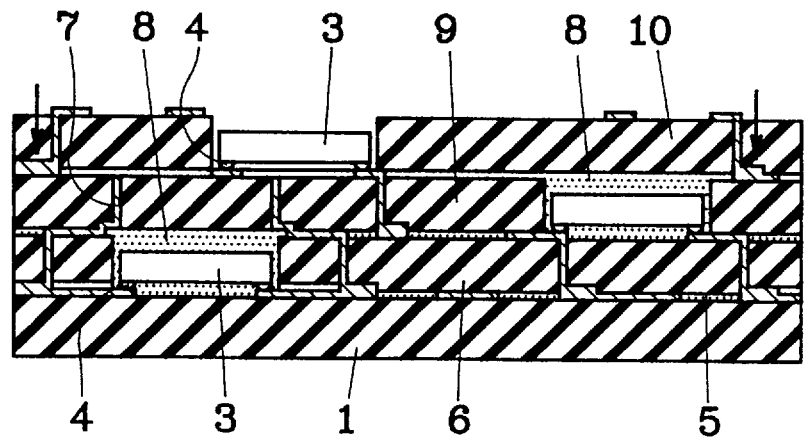
FIG. 8 is a longitudinal cross-sectional view showing an eighth step in the same method.

Eighthly, as shown in FIG. 8, a fourth insulating layer 10 is laminated on the third insulating layer 9 and it is bonded onto the main surface of the third insulating layer 9 by the coating layer 5. The fourth insulating layer 10 is also made of the same material as the second and third insulating layers 6 and 9, and the circuit component 3 is accommodated into the gap portion in the fourth insulating layer 10. Further, a part of the circuit patterns 2, such as the through hole conductor 7 formed on the main surface of the fourth insulating layer 10, is overlaid on top of a part of the circuit patterns 2 formed on the main surface of the third insulating layer 9, and the overlaid portion is irradiated with a laser beam through the fourth insulating layer 10 to thermally fuse the circuit patterns 2.

Figure 9:
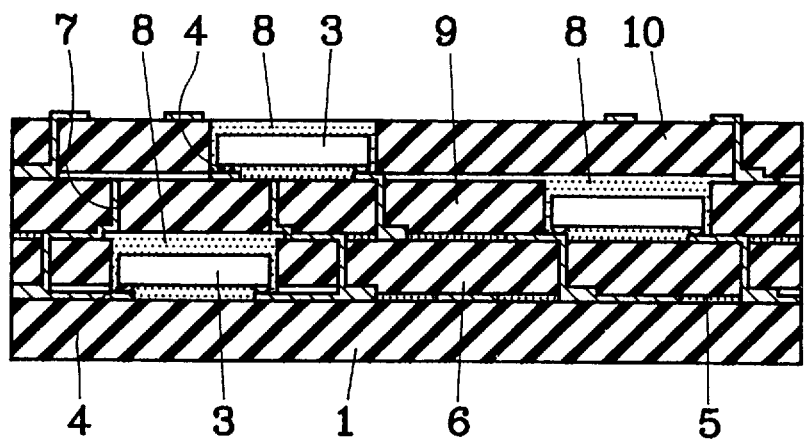
FIG. 9 is a longitudinal cross-sectional view showing a ninth step in the same method.

Ninthly, as shown in FIG. 9, the gap portions into which the circuit components 3 are accommodated are filled with a resin to hermetically seal the circuit components 3.

Figure 10:
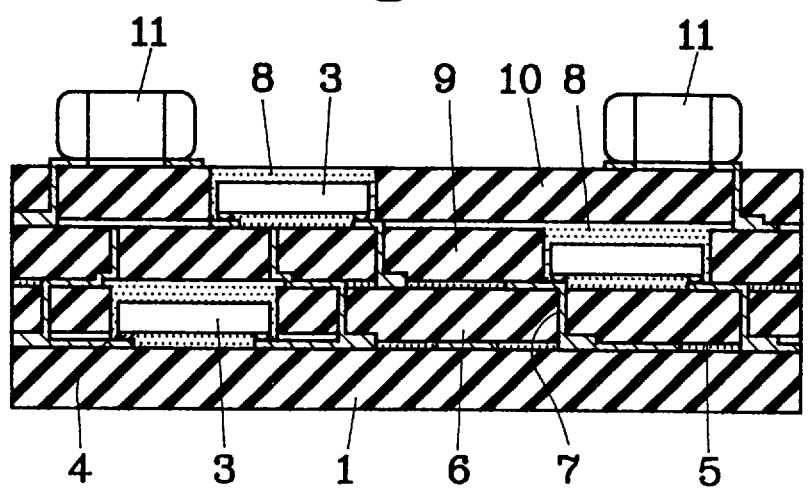
FIG. 10 is a longitudinal cross-sectional view showing a tenth step in the same method.

Tenthly, as shown in FIG. 10, circuit components 11 and 11, such as parts having a shape of chip, are mounted on the land electrodes serving as a part of the circuit patterns 2 on the fourth insulating layer 10 and the terminals thereof are conductively fixed to the circuit patterns 2 by soldering, etc. As a result, the hybrid module as shown in FIG. 10 can be completed.

Although the insulating layers are overlaid on top of another by four stages according to the first to tenth examples of the present invention, it is needless to say the insulating layers may be overlaid on top of one another by two, three or more than five stages.

What is claimed is:

1. A hybrid module comprising a plurality of insulating layers which are laminated on one another and circuit patterns formed on each surface of the insulating layers and/or formed between the insulating layers, said circuit patterns being connected with one another by through hole conductors, wherein a part of the circuit patterns adjacent the hole conductors and provided between the insulating layers and overlaid on top of another is thermally fused.

2. The hybrid module according to claim 1, wherein gap portions are defined by penetrating the plurality of insulating layers and circuit components are accommodated into the gap portions.

3. The hybrid module according to claim 1, wherein the gap portions into which the circuit components are accommodated are filled with a resin to hermetically seal the circuit components.

4. The hybrid module according to claim 1, wherein the insulating layers are bonded to one another by layers having adhesive properties.

5. The hybrid module according to claim 1, wherein at least one side of the insulating layers between which the thermally fused circuit patterns are formed is formed of a layer capable of transmitting a laser beam.

6. The hybrid module according to claim 1, wherein layers not capable of transmitting a laser beam are interposed between the insulating layers.

* * * * *